United States Patent [19]

Parrish

[11] 4,331,889
[45] May 25, 1982

[54] CHARGE COUPLED DEVICE FOCAL PLANE INTEGRATER

[75] Inventor: William J. Parrish, Santa Barbara, Calif.

[73] Assignee: Hughes Aircraft Co., Culver City, Calif.

[21] Appl. No.: 156,138

[22] Filed: Jun. 3, 1980

[51] Int. Cl.³ .................... H03K 3/42; G11C 19/28; H01L 29/78

[52] U.S. Cl. ................ 307/311; 307/221 D; 357/24

[58] Field of Search ............................. 357/24 LR, 30

[56] References Cited

U.S. PATENT DOCUMENTS

| | | | |
|---|---|---|---|
| 3,414,807 | 12/1968 | Evans | 340/347 NT |
| 4,092,549 | 5/1978 | Prince | 307/221 D |
| 4,145,689 | 3/1979 | Butler et al. | 340/347 NT |
| 4,270,060 | 5/1981 | Pines et al. | 357/24 LR |

*Primary Examiner*—Gene M. Munson

*Attorney, Agent, or Firm*—R. M. Wallace; W. H. MacAllister

[57] ABSTRACT

In a charge transfer device imager, photodetector output current is accumulated and stored during an integration period in an analog potential well in the substrate surface potential adjacent the photodetector, the analog well being reset each time the detector changes the amount of stored charge by a preselected fraction of the storing well capacity, simultaneously incrementing a digital count. At the end of each integration period, both the contents of the analog well and the digital count are read into an output register. As a result, the length of the integration period may be significantly extended without regard to the charge storing capacity of the charge transfer device, thus improving the signal-to-noise ratio and the dynamic range of the imager. In the preferred embodiment, the amount of charge stored in the analog potential well is sensed by sensing the potential of the photodetector, where the photodetector comprises a diode diffusion in the substrate.

11 Claims, 8 Drawing Figures a. $\phi_{RST}$ b. $\phi_T$ c. $\phi_C$ d.

e.

f.

CHARGE COUPLED DEVICE FOCAL PLANE INTEGRATER

TECHNICAL FIELD

This invention relates to charge coupled device (CCD) focal plane arrays in which an image is focused onto a plurality of photodetectors formed on a semiconductive substrate and a video signal is produced by generating charge packets from the photo-current of each photodetector, the charge packets being serially transferred in a CCD serial output register to create a multiplexed video signal, and in which the signal-to-noise ratio is enhanced by increasing the integration time or period during which each photodetector generates a photo-current.

BACKGROUND ART

Solid-state image sensing devices formed as charge transfer devices include both monolithic and hybrid focal plane arrays of the type disclosed in Sequin, et al., *Charge Transfer Devices*, Academic Press, New York (1975). A plurality of photodetectors is formed on the surface of the semiconductive substrate, each photodetector comprising a diode formed by a diode diffusion in the substrate. Radiation creates a hole-electron pair for each photon incident near the diode, generating a photo-current across the diode junction which is integrated to form a charge packet. Each charge packet is periodically loaded into one bit of a CCD serial output register, the contents of which are serially transferred from the CCD register as a video output signal.

The CCD serial output register is typically constructed by forming a serial succession of plural insulated electrodes overlying the semiconductive substrate, complementary clock signals being applied to alternate ones of the electrodes so that alternate pairs of electrodes define a single charge storing bit of the CCD register, as described in the Sequin publication referenced above. Charge storing bits are formed in the substrate surface beneath alternate ones of the electrodes as potential wells in the electrical surface potential of the substrate. In this manner, the CCD register has a serial train of adjacent successive charge storing bits, so that a single charge packet inserted into one of the charge storing bits of the register is serially transferred down the length of the register at a rate governed by the complementary clock signals. It is apparent that the charge storing capacity of each charge storing bit of the CCD register is limited by the area of the corresponding overlying electrode. If this charge storing capacity is exceeded by injection of an overly large charge packet, a portion of this large charge packet will be lost so that the signal which it represents is severely distorted.

The dynamic range and the signal-to-noise ratio of the video signal generated by the plurality of photodetectors is significantly improved by increasing the integration period during which each photodetector generates a photo-current which is accumulated to form a charge packet. Increasing the integration period must necessarily increase the size of the charge packet so that it may exceed the charge storing capacity of the CCD output register. Therefore, the integration period of the focal plane array of photodetectors is limited by the charge storing capacity of the CCD output register, thus significantly limiting both the dynamic range and the signal-to-noise ratio of the video output signal. This problem is especially severe in staring focal plane arrays in which the focal plane of photodetectors constantly views the same field of view and is not scanned. While the problem of a limited integration period has been at least partially solved by scanning the image across a plurality of columns of photodetectors in a scanning focal plane array, the problem still remains that the integration period of staring focal plane arrays is significantly limited by the charge storing capacity of the CCD output register.

The problem of a limited integration period in image sensors is particularly significant because any image sensor operates with a certain amount of noise, electronic and otherwise, over which the image signal must be superimposed. Furthermore, the contrast of dark and light portions of the image may impose severe requirements upon the dynamic range of the image sensor. Therefore, it has been a goal in the art to provide a CCD image sensor having a long integration period to provide good signal-to-noise ratio and high performance quality under dimly lit or indoor lighting conditions while at the same time having large dynamic range so that under bright conditions a long integration period does not exceed the system capacity. While one obvious way to achieve these goals would be simply to increase the charge storing capacity of each serial bit of the CCD output register, such an increase in capacity would typically require an increase in the electrode area of the CCD register, thus increasing the size of the device, sacrificing one of the chief advantages of forming the image sensor as a miniaturized charge transfer device or CCD.

SUMMARY OF THE INVENTION

The foregoing problems are overcome in the present invention in which the photo-current generated by a photodetector is integrated in two CCD charge storing potential wells, one well storing a charge packet representing a digital count proportional to the charge generated by the photodetector, the other well storing a charge packet proportional to the analog remainder between the digital count and the exact amount of charge generated by the photodetector. The pair of charge packets thus generated during each integration period of the photodetetor is parallel loaded into the CCD output register.

The invention operates as follows. During the integration period, the photodetector removes charge from the analog well. The well, which has a finite charge storage capacity, is never emptied so that its capacity is not exceeded because, whenever the charge removed from the analog well exceeds a selected fraction such as one-half the capacity of the well, the well is replenished by a corresponding amount of charge, which replenishment simultaneously increments the charge packet stored in the digital count charge storing well. The incrementation of the "digital" charge packet may be very small so that it may be incremented many times without exceeding the CCD charge storing capacity, thus permitting the photodetector to remove a large amount of charge during a long integration period and yet never exceed the capacity of the charge coupled device.

In a first embodiment of the invention, a resetting circuit continuously monitors the charge removed from the analog well by the photodetector by sensing the photodetector potential and refills the analog well each time the stored charge falls below one-half the capacity of the analog well, simultaneously generating a logic signal which increments the charge stored in the digital well. At the end of the integration period, the charge remaining in the analog well is loaded into the CCD output register as the analog charge packet, while the incremented charge packet in the digital well is loaded into another bit of the CCD output register as the "digital" charge packet.

In the preferred emboidments of the invention, consumption of direct current electrical power is eliminated by providing an improved resetting circuit which samples the analog charge storing well many times during a single integration period rather than continuously monitoring it. The invention may be constructed so that the photodetector either removes charge from a previously filled analog charge storing well as described above, or alternatively, adds charge to a previously emptied analog charge storing well. In such an alternative embodiment, the digital count is incremented each time the stored charge in the analog well exceeds one-half the capacity of the well, at which time a corresponding amount of charge is removed from the analog well (rather than replenishing the well).

This invention permits long integration periods so that each photodetector may generate or withdraw a large amount of charge over a long period of time for an enhanced signal-to-noise ratio and dynamic range, while the charge generated or withdrawn by the photodetector may far exceed the capacity of a single charge storing well or CCD bit. However, the analog charge storing well will never have more than a selected fraction such as one-half of its charge storing capacity substantially depleted (or exceeded in the alternative embodiment). Very fine accuracy is achieved by dumping the remainder of charge left in the analog well at the end of the integration time into the CCD output register as an analog remainder charge packet while the digital count charge packet in the adjacent channel is also dumped into a separate storage bit of the CCD register. As a result, the integration time of each photodetector may be significantly increased, thus providing significantly improved signal-to-noise ratio and dynamic range without requiring any increase in the size of electrode area of the charge coupled device.

BRIEF DESCRIPTION OF THE DRAWINGS

The invention is best understood by reference to the accompanying drawings of which.

DETAILED DESCRIPTION OF THE INVENTION

Figure 1:
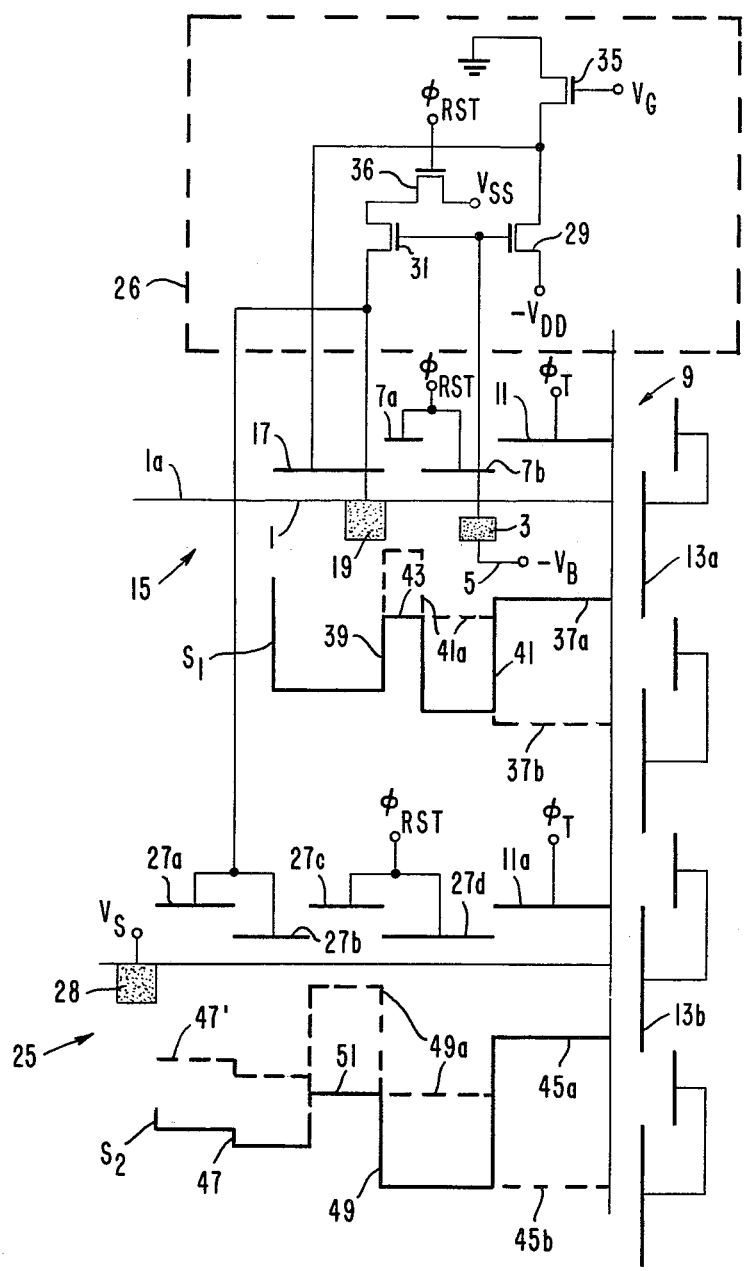
FIG. 1 is a simplified schematic diagram of a first embodiment of the charge coupled device of the present invention and includes corresponding surface potential diagrams.

FIG. 1 is a schematic diagram of a unit cell in a charge transfer device focal plane array comprising a plurality of such unit cells forming an image sensing array of the type disclosed in Sequin, et al., *Charge Transfer Devices*, Academic Press, New York (1975). The focal plane array is formed on a semiconductive substrate 1 preferably having n-type conductivity, and each unit cell of the focal plane array includes a single photosensor comprising a p-type diffusion 3 on the back surface (not shown) of the substrate 1. An electrode 5 on the photosensor diffusion 3 has an applied bias voltage $V_b$ maintaining an electrical field across the boundary or junction of the photosensor diffusion 3. Preferably, the bias voltage $V_b$ is negative with respect to the potential of the substrate 1 so that P-channel minority carriers are withdrawn from the top surface 1a of the substrate 1 into the photosensor diffusion 3 whenever radiation of an infrared frequency is incident on the substrate 1 in accordance with principles well known to those skilled in the art as described in the aboverefe- renced Sequin publication. (Alternatively, if the bias voltage $V_b$ is positive with respect to the potential of the substrate 1, then radiation will cause minority carriers to flow in an opposite sense from the photosensor 3 into the top surface 1a of the substrate 1.)

Minority carriers (holes) are stored adjacent the diffusion 3 in the substrate surface 1a beneath an overlying storage electrode 7b and are periodically transferred into one storage bit of an adjacent CCD serial register 9 under the control of the clocked transfer electrode 11. A photo-current across the junction of the diffusion 3 depletes the charge packet stored beneath the electrode 7b during an integration period, after which the transfer electrode 11 is clocked to transfer this charge packet into the output CCD register 9. If the integration period is increased by decreasing the rate at which the transfer electrode 11 is clocked (in order to improve signal quality), the amount of charge withdrawn to the photosensor diffusion 3 during the period may exceed the charge storing capacity $Q_o$ of the charge storing electrode 7b so as to completely use up the stored charge under the electrode 7b before the end of the integration period. Therefore, the integration period, defined by the interval in which the transfer electrode 11 is clocked, must necessarily be limited by the area of the storage electrode 7b for a given electrode potential in order to avoid exceeding the CCD charge storing capacity, which is a problem solved by the present invention.

In the present invention, two charge flow channels, 15, 25, and a reset circuit 26 are provided as shown in FIG. 1, which allow the integration period to be extended while preventing the additional charge withdrawn to the photodetector diffusion 3 from exceeding the charge storing capacity $Q_o$ of the electrode 7. This is accomplished by the reset circuit 26 which replenishes the stored charge beneath the electrode 7b each time it is depleted below a selected fraction of its charge storing capacity $Q_o$, which, in the preferred embodiment, is one-half ($\frac{1}{2} Q_o$). Simultaneously with the replenishing or refilling step, the reset circuit 26 causes an incremental amount of charge to be injected into the second adjacent charge flow channel 25 as a digital count.

Referring to FIG. 1, the analog flow channel 15 includes the photosensor diffusion 3, a pair of analog storage electrodes 7a, 7b connected to receive a clock signal $\phi_{RST}$, a transfer electrode 11 adjacent the storage electrode 7b, a feedback electrode 17 adjacent the storage electrode 7a, and a feedback diffusion 19 of p-type conductivity in the surface of the n-type substrate 1 beneath the feedback electrode 17.

The digital charge flow channel 25 includes an input diffusion 28 of p-type conductivity in the substrate surface 1a, a plurality of electrodes 27 and a transfer electrode 11a. The transfer electrodes 11 and 11a control the transfer of charge from the first and second charge flow channels 15 and 25 into first and second storage bits of the CCD output register 9 defined by first and second storage electrodes 13a, 13b, respectively. The electrode pair 27c, 27d adjacent the transfer electrode 11a are connected to receive the clock signal $\phi_{RST}$, while the transfer electrodes 11 and 11a are connected to receive a clock signal $\phi_t$. The input diffusion 28 is connected to a bias voltage supply $V_s$. The electrodes 7, 11, 13, 17 and 27 are all insulated from the surface of the substrate 1 by a suitable dielectric layer (not shown).

The reset circuit 26 includes cut-off and cut-on transistors 29, 31, respectively, and a resistive load transistor 35, all being formed as P-channel metal oxide semiconductor field effect transistors (MOSFET's) on the substrate 1. The cut-on transistor 31 initiates a regenerative feedback loop in which charge is rapidly ejected from beneath the feedback electrode 17 to replenish the charge stored beneath the analog electrode 7b whenever it is depleted to one-half of its storing capacity, $\frac{1}{2} Q_o$. The cut-off transistor 29 terminates the regenerative feedback as soon as the charge stored beneath the analog electrode 7b is refilled to $Q_o$, its full capacity.

The cut-off transistor 29 has its gate connected to the photodetector diffusion 3, its drain connected to a negative drain voltage supply $V_{dd}$ and its source connected to the feedback electrode 17. The cut-on MOSFET 31 has its gate connected to the gate of the cut-off MOSFET 29, its source connected to a positive source voltage supply $V_{ss}$ through a reset transistor 36 and its drain connected to the diffusion 19 and also to the electrode pair 27a, 27b (adjacent the input diffusion 28) in the digital charge flow channel 25. The gate of the reset transistor 36 is connected to receive the clock signal $\phi_{RST}$. The resistive load MOSFET 35 has its source connected to ground, its drain to the source of the cut-off MOSFET 29 and its gate to a constant bias voltage supply $V_G$.

The electrical substrate surface potential $S_1$ in the analog charge flow channel 15 is plotted in FIG. 1 directly beneath the charge flow channel 15, and includes a first charge storing potential well 39 underlying the feedback electrode 17 and a second charge storing well 41 directly underlying the storage electrode 7b separated from the first well 39 by a potential barrier 43 directly underlying the electrode 7a. Similarly, the substrate surface potential $S_2$ in the second charge flow channel 25 is plotted in FIG. 1 directly beneath the channel 25 and includes a first potential well 47 underlying the electrode pair 27a, 27b and a second potential well 49 underlying the electrode 27d separated from the first well 47 by a potential barrier 51 underlying the electrode 27c.

Operation commences with the initial conditions that the potential well 41 in the substrate surface beneath the electrode 7b is filled with minority carriers, namely holes. Radiation or light incident upon the substrate 1 generates a photo-current under the influence of the negative bias voltage $V_b$ applied to the terminal 5, the photo-current withdrawing charge from the well 41 to the diffusion 3. Charge continues to be withdrawn from the potential well 41 beneath the storage electrode 7b until the well is depleted to half its capacity, at which time the potential well 41 is replenished by the reset circuit 26 to its full capacity charge level $Q_o$, while, simultaneously, an incremental amount of charge is injected from the diffusion 28 into the digital count channel 25. The process is repeated a number of times during a single integration period if radiation generates a photo-current of sufficient magnitude to deplete the potential well 41 by one-half of its total charge storing capacity an equal number of times during the integration period, simultaneously incrementing the charge stored in the digital channel 25 the same number of times, until the clock signal $\phi_t$ (applied to the transfer electrodes 11 and 11a) is pulsed negatively to terminate the integration period. Then, the incremented charge stored in the digital channel 25 is transferred into the second storage bit of the CCD register 9 while the charge remaining in the well 41 in the analog channel 15 is transferred into the first storage bit of the serial output register 9. Thus, at the end of the integration period, the second storage bit of the output CCD register 9 contains a charge packet representing a digital count while the first storage bit contains a charge packet corresponding to an analog remainder $Q_r$ representing the analog difference between the digital count and the total charge generated by the photo-current during the integration period.

Figure 3:
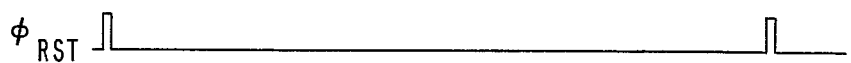
FIG. 3a is a diagram of the time domain waveform of the clock signal $\phi_{rst}$ applied to the devices of FIGS. 1 and 2.
FIG. 3b is a diagram of the time domain waveform of the clock signal $\phi_T$ applied to the device of FIGS. 1 and 2.
FIG. 3c is a diagram of the time domain waveform of the clock signal $\phi_c$ applied to the device of FIG. 2.
FIG. 3d is an exemplary plot of the amount of charge stored as a function of time in the analog charge storing well in the device of FIG. 1.
FIG. 3e is an exemplary plot of the amount of charge stored as a function of time in the analog charge storing well in the device of FIG. 2.
FIG. 3f is an exemplary plot of the amount of charge stored as a function of time in an analog charge storing well adjacent the photodetector in an alternative embodiment (not shown) in which charge is added to the analog well during the integration period (rather than being removed as in the embodiments of FIGS. 1 and 2).
Figure 3:
Figure 3:
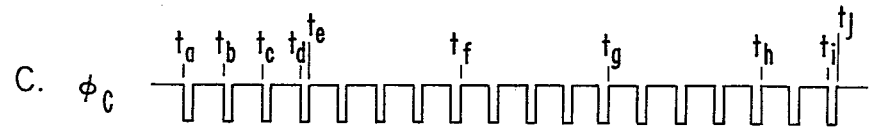
Figure 3:
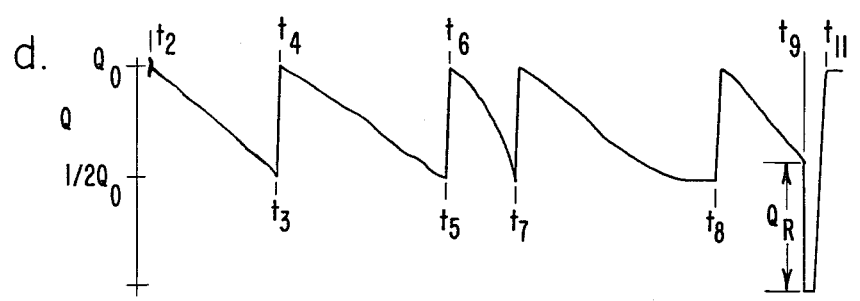
Figure 3:
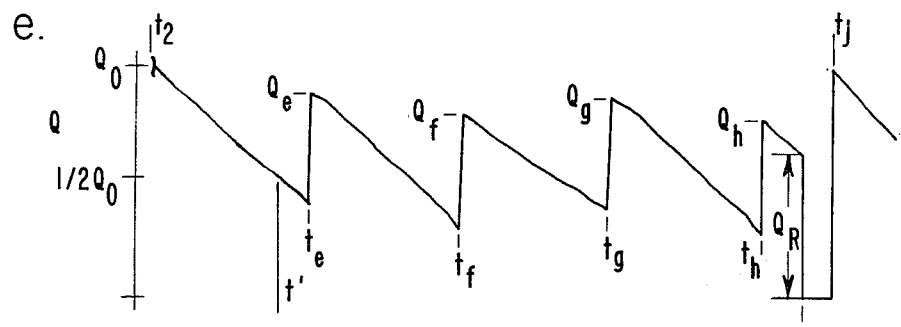
Figure 3:
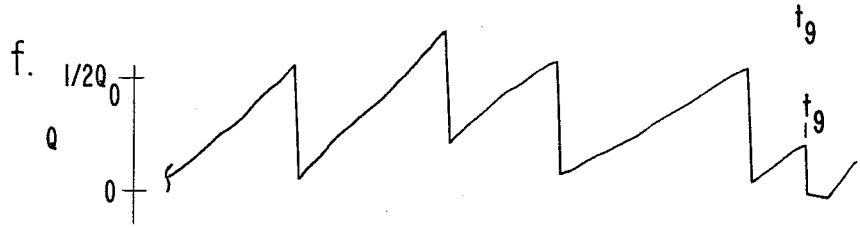

Operation of the device of FIG. 1 will now be described in detail by simultaneous reference to the time domain waveforms of FIGS. 3a, 3b and 3d. The potential well 41 beneath the electrode 7b is initially filled with minority carriers. The photodetector 3 begins to remove charge from the well 41 at time $t_2$ at a rate proportional to the amount of radiation incident upon the detector 3. Therefore, the amount of charge Q stored in the well 41 begins to decrease at time $t_2$ as illustrated in FIG. 3d. The connection between the detector diffusion 3 and the gates of the transistors 29, 31 provides a means for sensing the amount of charge stored in the analog well 41. As the positive charge Q stored in the well 41 decreases, the positive potential applied from the photodetector diffusion 3 to the gates of the transistors 29, 31 also decreases, beginning at time $t_2$. As a result, the negative potential applied through the transistor 29 from the voltage source $V_{dd}$ to the feedback electrode 17 increases, increasing the depth of the well 39. Eventually, at time $t_3$ of FIG. 3d, the voltage applied to the gate of the transistor 31 is decreased to its threshold voltage so that the transistor 31 begins to conduct, causing a positive potential to be applied from the voltage source $V_{ss}$ through the transistor 31 to the diffusion 19 so as to inject charge from the diffusion 19, causing charge in the potential well 39 to overflow the potential barrier 43 into the well 41 so as to replenish the charge stored therein. Preferably, the threshold voltage of the transistor 31 is reached whenever the charge Q stored in the well 41 has decreased to half the charge storing capacity $Q_o$ of the well 41. However, by properly selecting the voltage supply $V_{SS}$, a fraction other than one-half may be chosen.

Referring to FIG. 3d, at time $t_3$ the positive charge overflowing the potential barrier 43 begins to increase the amount of charge Q stored in the well 41, thereby increasing the amount of positive voltage applied from the detector diffusion 3 to the gates of the transistors 29 and 31 (so as to decrease the negative voltage applied to the feedback electrode 17) thus decreasing the depth of the well 39 so that charge is ejected from the well 39 into the well 41 at an increasing rate. Thus, a regenerative feedback loop is created and charge flowing over the potential barrier 43 into the well 41 causes the source-to-drain conductance of the transistor 29 to decrease by raising the potential on its gate, causing the negative potential on the electrode 17 to decrease and therefore causing the depth of the well 39 to decrease, further increasing the rate at which charge flows over the potential barrier 43 from the well 39 into the well 41. The rate at which this regenerative feedback forces charge to overflow the potential barrier 43 may be maximized by maximizing the area of the electrode 17 so as to be greater than the area of the electrode 7b.

At time $t_4$ the charge overflowing the barrier 43 has refilled the potential well 41 so that the amount of positive charge Q stored in the well 41 is now replenished to its maximum full level $Q_o$. Consequently, the positive potential applied from the photodetector diffusion 3 to the gates of the transistors 29 and 31 is at a maximum and therefore causes these transistors to be turned off, terminating the flow of charge over the barrier 43 so that the system returns to its original state. The cycle is then repeated so that the detector diffusion 3 continues to receive charge from the well 41 until the charge Q stored in the well 41 is depleted to half the well capacity ($\frac{1}{2} Q_o$ at time $t_5$ so that charge again overflows the barrier 43 until the well 41 is again refilled at time $t_6$. Referring to the example of FIG. 3d, charge again overflows the barrier 43 at times $t_7$ and $t_8$.

Each time the potential well 41 is depleted to one-half its capacity at times $t_3$, $t_5$, $t_7$ and $t_8$, an incremental amount of charge is injected beneath the electrode 27d in the digital channel 25 to form a digital count as follows. During the time interval $t_2$ to $t_3$, the transistor 31 is off, as previously described, so that no positive potential is applied to the electrodes 27a, b in the digital channel 25. Therefore, from time $t_2$ to time $t_3$ the surface potential $S_2$ beneath the electrodes 27a, b is a potential well 47 (shown in solid line) which is filled with a small charge from the diffusion 28 by equilibration. At time $t_3$ when the charge stored in the analog well 41 in the analog channel 15 is depleted to one-half its capacity, the transistor 31 turns on, as previously described, causing a positive potential to be applied to the electrodes 27a, b by reason of their connection to the drain of the transistor 31, thus raising the surface potential $S_2$ beneath the electrodes 27a, b to the dashed line barrier position 47', causing the small charge previously stored in the well 47 to flow over the barrier 51 and into the large potential well 49 beneath the electrode 27d. (Preferably, the capacity of the large potential well 49 greatly exceeds the size of the small charge thus injected.).

As soon as the transistor 31 is turned off at time $t_4$, the potential beneath the electrodes 27a, b returns to the solid line potential well position 47 so that the process repeats itself at times $t_5$, $t_7$ and $t_8$. The charge stored in the potential well 49 in the digital channel is thus incremented each time the analog well 41 is depleted to one-half its capacity. The charge stored in the potential well 49 therefore represents a digital count of the number of times that the transistor 31 has been turned on during the integration period commencing at time $t_2$, corresponding to the number of times the incident radiation has depleted the charge Q stored in the well 41 to one-half of its capacity.

Referring to FIG. 3b, the integration period is terminated at time $t_9$ when the clock signal $\phi_t$ is pulsed negatively, causing the surface potential beneath the transfer electrodes 11 and 11a to fall from the solid line position barriers 37a and 45a, respectively, to the dashed line position 37b and 45b, respectively. Simultaneously, the clock signal $\phi_{RST}$ is pulsed positively at time $t_9$, turning off the reset transistor 36 so that the source voltage $V_{SS}$ is removed from the gate of the cut-on transistor 31 to terminate any regenerative current flow beneath the electrode 7a, while raising the surface potentials beneath the electrodes 7a, b and 27c, d to the dashed line barriers 41a, 49a, respectively. As a result, the charge $Q_r$ remaining in the analog potential well 41 at time $t_9$ is transferred into the first charge storing bit beneath the electrode 13a of the output CCD register 9 while the charge stored in the digital well 49 is transferred into an adjacent charge storing bit beneath the electrode 13b of the output CCD register 9.

The charge stored in the analog well 41 is replenished in preparation for the next integration period as follows. At time $t_{10}$ of FIG. 3a, the clock signal $\phi_{RST}$ returns to its original (lower) voltage, so that the surface potentials beneath the electrodes 7b and 27d again form the solid line potential wells 41 and 49, respectively. Simultaneously, the reset transistor 36 is turned on so that the source voltage $V_{SS}$ is again applied through the reset transistor 36 to the cut-on transistor 31, thus reactivating the reset circuit 26. Because the analog well 41 is empty at this time, the reset circuit 26 functions in the manner previously described to sense that the stored charge in the analog well 41 is less than one-half the well capacity ($\frac{1}{2} Q_o$) and replenishes the well 41 from time $t_{10}$ to time $t_{11}$. Therefore, at time $t_{11}$, the system is returned to the state which it was in at time $t_1$ and the entire process is cyclically repeated.

In the example illustrated in FIG. 3d, the amount of radiation incident on the substrate 1 generates a photo-current flowing to detector diffusion 3 which depletes the analog storage well 41 to one-half its capacity ($\frac{1}{2} Q_o$) four times during the integration period so that at time $t_9$ the digital storage well 49 contains large representing a digital count of four while the analog storage well 41 contains a remainder of charge $Q_r$ equal to the total amount of charge withdrawn to the photodetector diffusion 3 during the integration period from time $t_2$ to time $t_9$ minus the analog difference of the digital count (four) (the digital count being multiplied by one-half the charge storing capacity, $\frac{1}{2} Q_o$, of the analog well 41). This may be expressed as follows: $Q_r$=total charge withdrawn-(digital count)$\times \frac{1}{2} Q_o$. Therefore, the digital count stored in the well 49, together with the analog remainder $Q_r$ stored in the well 41, provide an exact readout of the charge withdrawn to the photodetector diffusion 3 during the integration period from time $t_2$ to time $t_9$. The integration period may be drastically increased so that the amount of charge withdrawn by the photo-current may far exceed the charge storing capacity of the analog well 41, thus raising the digital count to a very large number far in excess of four. Preferably, each time the potential on the control electrode pair 27 in the second channel 25 is raised, the charge in the digital well 49 is incremented by a very small amount so that the well 49 may hold a very large digital count corresponding to a very long integration period to provide a very high signal-to-noise ratio and a very large dynamic range for the output video signal.

Significantly, the load transistor 35 of the reset circuit 26 consumes dc (direct current) electrical power almost continuously while the device is operating, a distinct disadvantage. This problem is overcome in the preferred embodiment of the invention illustrated in FIG. 2 in which the amount of charge Q stored in the analog well 41 is not continuously monitored but instead is periodically sampled during extremely short intervals of time. In the preferred embodiment of FIG. 2, a clocked bistable latch 60, comprising P-channel dual gate MOSFET's 61, 63 and P-channel MOSFET's 81, 85, is substituted for the reset circuit 26 and controls charge injection into the analog well 41 from an input diffusion 19a connected to a bias voltage supply $V'_s$. Furthermore, the electrode 17 of FIG. 1 is divided into an electrode pair 17a, 17b in the device of FIG. 2.

The transistor 63 is formed on the n-type substrate 1 and comprises P-type source and drain diffusions 63a and 63b, a first gate 63c and a second parallel gate 63d. Similarly, the dual gate FET 61 includes a source and a drain 61a, 61b, and parallel dual gates 61c, 61d.

The bistable latch 60 is constructed by connecting diffusions 61b and 63b to ground, while connecting diffusions 61a and 63a through the source and drain of the transistors 81 and 85, respectively, to receive the clock signal $\phi_c$ illustrated in FIG. 3c. The gates of the transistors 81 and 85 are connected together to a gate voltage source $V_g$ comparable to the threshold voltage of the transistors 81, 85. Latching feedback is provided by connecting the drain diffusion 63a to the gate 61d and connecting the drain diffusion 61a to the gate 63d. A reference voltage $V_{ref}$ is applied to the gate 63c while the signal voltage $V_{sig}$ of the photodetector diffusion 3 is applied to the gate 61c.

Figure 2:
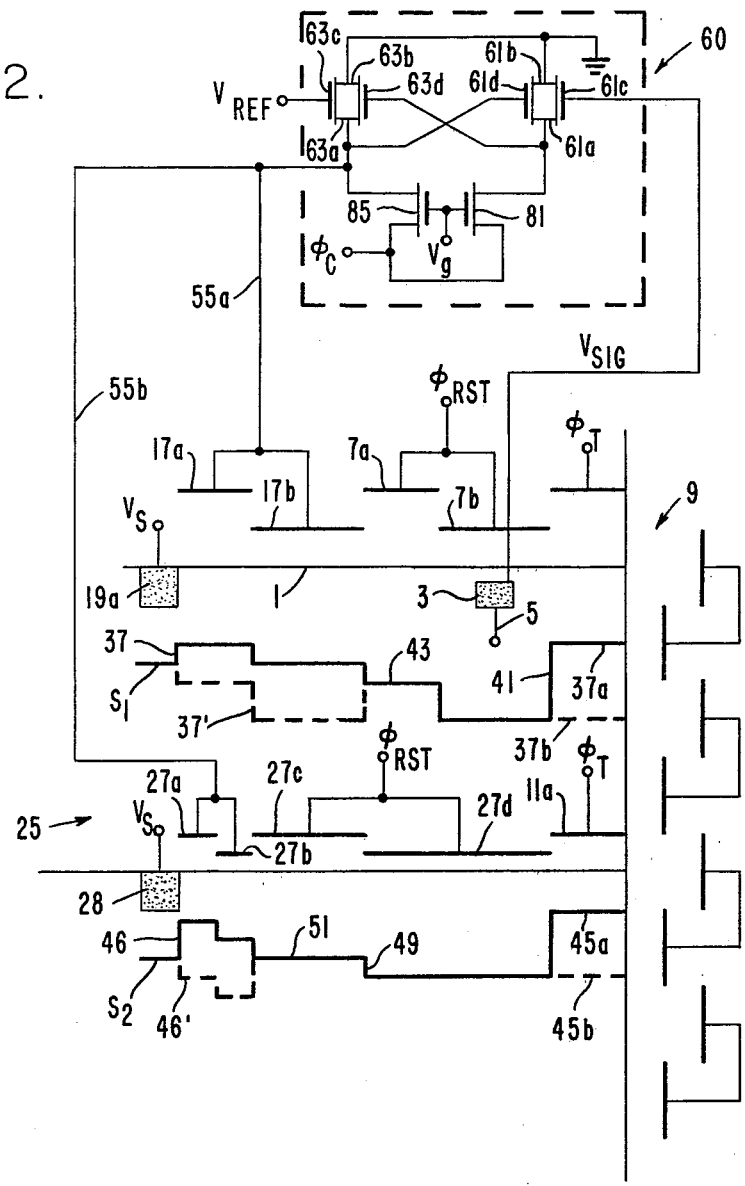
FIG. 2 is a simplified schematic diagram of the preferred embodiment of the charge coupled device of the present invention and includes corresponding surface potential diagrams.

The device of FIG. 2 operates in a manner similar to the device of FIG. 1 to store a digital count in the digital charge storing well 49 proportional to the charge withdrawn by the photodetector 3 and to form an analog remainder $Q_r$ in the analog charge storing well 41, with the exception the the charge content of the analog well 41 is not continuously monitored but, instead, is rapidly sampled by the bistable latch 60 during very short intervals defined by the pulse width of the clock signal $\phi_c$ applied to the transistors 81 and 85.

Operation of the device of FIG. 2 will now be described by simultaneous reference to the time domain waveforms illustrated in FIGS. 3a, 3b, 3c and 3e. Initially, the analog well 41 stores its full capacity of charge and, at time $t_2$, the photocurrent flowing to the photodetector diffusion 3 begins to withdraw minority carriers from the analog well 41 so that the positive charge Q stored in the well 41 decreases at a rate proportional to the amount of radiation incident upon the substrate 1 as illustrated in FIG. 3e. As long as the positive charge Q in the well 41 exceeds one-half the capacity $Q_o$ of the analog well 41, the positive signal voltage $V_{sig}$ applied to the gate 61c of the latch 60 exceeds the reference voltage $V_{ref}$ applied to the gate 63c of the latch 60. (Preferably, the voltage $V_{ref}$ is selected so that $V_{sig}$ equals $V_{ref}$ whenever the potential well 41 is filled to one-half of its charge storing capacity $Q_o$, although a fraction other than one-half may be selected.) As the charge Q stored in the well 41 decreases by virtue of the photo-current withdrawn through the detector diffusion 3, the clock signal $\phi_c$ applied to the transistors 81 and 85 causes a negative voltage to be applied to the diffusions 61a and 63a during the short intervals defined by the pulse width of the clock signal $\phi_c$, at times $t_a$, $t_b$, and $t_c$, as illustrated in FIG. 3c. Because the voltage $V_{sig}$ applied to the transistor 61 is more positive than the voltage $V_{ref}$ applied to the transistor 63, conduction between the source and drain of the transistor 61 is cut off, causing a large negative voltage drop across the transistor 61. The negative voltage drop across the transistor 61 is applied as feedback to the gate 63d of the transistor 63, which turns the source-to-drain conduction in the transistor 63 "on". As a result, there is substantially no voltage drop across the transistor 63 so that approximately zero volt potential is applied through the conductors 55a and 55b to the control electrode pairs 17 and 27, respectively. Referring to FIG. 2, the zero potential applied to the electrodes 17 and 27 maintains the surface potential $S_1$ beneath the electrode pair 17 at the solid line position 37 and the surface potential $S_2$ beneath the electrode pair 27 at the solid line position 46, respectively. The surface potentials 37 and 46 are higher than the potential $V_s$ applied to the input diffusions 19a and 28 adjacent the electrodes 17 and 27 respectively, and therefore charge does not flow from either of the input diffusions 19a and 28.

At time $t'$ of FIG. 3e, the charge stored in the analog well 41 falls below one-half the total capacity of the well 41 ($\frac{1}{2} Q_o$) due to the withdrawal of charge by the photo-current to the detector diffusion 3. Therefore, at time $t'$, the photodetector potential $V_{sig}$ applied to the transistor 61 becomes less than the reference voltage $V_{ref}$ applied to the transistor 63 so that the transistor 61 has a greater source-to-drain conductivity than the transistor 63. Subsequently, at time $t_d$ the clock signal $\phi_c$ is again pulsed negatively, creating a greater negative voltage drop across the transistor 63 and a smaller negative voltage drop across the transistor 61. The negative voltage drop across the transistor 63 is applied as feedback to the gate 61d of the transistor 61, turning the transistor 61 completely on until no voltage drop appears across the transistor 61. Therefore, the gate 63d no longer receives a negative voltage and the transistor 63 is turned off. Consequently, the bistable latch 60 rapidly changes state at time $t_d$, causing a large negative voltage drop to appear across the transistor 63. The large negative voltage drop across the transistor 63 is applied through the conductors 55a and 55b to the electrodes 17 and 27 in the analog and digital channels 15 and 25, respectively, causing the surface potentials beneath the electrodes 17 and 27 to fall to the dashed line potential wells 37' and 46', respectively, illustrated in FIG. 2. As a result, at time $t_d$ the input diffusion 19a in the analog channel 15 injects charge into the potential well 37' while the input diffusion 28 in the digital channel 25 injects charge into the potential well 46'. Subsequently, at time $t_e$ the clock signal $\phi_c$ is turned off so that a negative voltage is no longer applied to the electrode pairs 17 and 27. Therefore, the surface potentials $S_1$, $S_2$ in the analog and digital charge flow channels 15 and 25 return to the solid line barrier positions 37 and 46, respectively, sending the previously injected charge packets into the analog and digital charge storing wells 41 and 49, respectively. The charge injected at time $t_e$ into the analog well 41 is preferably equal to $\frac{1}{2} Q_o$, or one-half the charge storing capacity of the well 41, as illustrated in FIG. 3e. The charge injected into the digital storage well 49 is preferably an incremental amount representing one digital count.

The cycle is subsequently repeated because charge is continuously withdrawn from the analog well 41 to the detector diffusion 3, and the analog well 41 is again refilled at times $t_f$, $t_g$ and $t_h$ in the example illustrated in FIG. 3e, causing the count in the digital well 49 to be incremented simultaneously. It should be noted that time t', at which the analog well 41 is first depleted below its one-half capacity level, occurs slightly before the next sampling time $t_d$ of the clock signal $\phi_c$. This delay causes the charge Q in the analog well 41 to be further depleted below one-half the maximum well capacity $Q_o$ before the well 41 is replenished at time $t_e$, so that the well 41 is not completely refilled to its maximum capacity but instead contains an amount of charge $Q_e$ slightly less than the full capacity of the well 41. The amount by which $Q_e$ is less than the full capacity of the well 41 is proportional to the delay between time t' and time $t_d$. Because this time delay may differ each time the well 41 is refilled, the level to which the analog well 41 is refilled may vary each time the system is reset at times $t_e$, $t_f$, $t_g$ and $t_h$ so that the charge levels $Q_e$, $Q_f$, $Q_g$, $Q_h$ to which the analog well 41 is refilled at times $t_e$, $t_f$, $t_g$ and $t_h$, respectively, may vary in a random manner as illustrated in FIG. 4e. However, this has no effect on the accuracy of the device readout because the presence of an analog "remainder" charge packet always provides an accurate readout at the end of the integration period.

Finally at $t_9$, the integration period is terminated when the clock signal $\phi_t$ is pulsed negatively and the clock signal $\phi_{RST}$ is pulsed positively, causing the packet of charge $Q_r$ remaining in the analog well at time $t_9$ to be dumped into a first bit of the CCD register 9 while the digital count charge packet in the well 49 is dumped into a second bit of the CCD register 9 respectively in the manner previously described in connection with FIG. 1.

The analog well 41 is replenished in preparation for the next integration period as follows. At time $t_i$ the clock signal $\phi_c$ causes the bistable latch 60 to again sample the analog well 41. Because the analog well 41 is empty at this time, the latch 60 causes it to be replenished at time $t_j$ so that until the analog well 41 again stores charge in excess of one-half its capacity ($\frac{1}{2} Q_o$) in the manner previously described and the system returns to the state it was in at time $t_2$ and is ready to repeat the process for the next integration period.

In the embodiment of FIG. 2, as in the embodiment of FIG. 1, the photo-current withdrawn to the photodetector diffusion 3 during the integration period from time $t_2$ to time $t_9$ is exactly equal to the digital count (represented by the digital charge packet in the second bit of the output CCD register 9) multiplied by one-half the charge storing capacity ($\frac{1}{2} Q_o$) of the well 41, plus the analog remainder charge $Q_r$ (stored in the first bit of the CCD register 9), so that the readout stored in the output register 9 represents the integrated photodetector output to a very high accuracy.

The advantage of the preferred embodiment of FIG. 2 is that the improved resetting means, namely the latch 60, consumes electrical power only when the clocked transistors 81 and 85 are turned on by the clock signal $\phi_c$ during the short pulse width of the clock signal $\phi_c$, and therefore consumes virtually no dc electrical power, greatly reducing the power consumption of the device. Another advantage is that, by synchronously clocking the bistable latch 60 and the transfer electrodes 11, 11a with the clock signals $\phi_c$ and $\phi_T$ respectively, simultaneous occurrence of replenishment of the analog well 41 and charge transfer into the register 9 is prevented.

While the device of FIG. 2 has been described as using a photosensor diffusion 3 having a negative bias voltage $V_b$ applied to its bias terminal, it should now be apparent to those skilled in the art that an alternative device may be fabricated in accordance with the invention in which the photosensor diffusion 3 is biased by a voltage which is positive with respect to the substrate 1 so that the photo-current is generated in an opposite sense to inject charge into the analog charge storing well 41 in response to incident radiation, instead of withdrawing charge. An exemplary graph of the amount of charge stored in the storage well 41 as a function of time in such an alternative device is illustrated in FIG. 3f, showing that the charge stored in the analog well in this alternative device is reset to zero at the beginning of the integration period, and that each time the amount of charge stored exceeds one-half the total capacity of the well 41, the system operates to remove one-half the amount of charge stored therein. That the function of such an alternative device is equivalent to the function of the devices of FIGS. 1 and 2.

Thus, there has been provided a CCD focal plane integrator which permits long integration periods during which the video signal is integrated to enhance its signal-to-noise ratio and increase its dynamic range without exceeding the charge storing capacity of the charge coupled device. The photodetector, in the preferred embodiment, subtracts charge from a charge storing analog well, which is refilled each time the integrated photo-current exceeds one-half the charge storing capacity of the well, each refilling incrementing a digital counter comprising a digital charge flow channel storing a charge packet. At the end of the integration period, the digital channel contains a charge packet representing a digital count of the integral of the photocurrent, while the analog well contains an analog remainder. As a result, the integration period of a CCD imager using this invention is not limited by the size or charge storing capacity of the device, thus permitting a CCD imager of reduced size to be fabricated having improved signal-to-noise ratio and a dynamic range relatively uninhibited by CCD capacity or small device geometry, thereby providing a significant advance in the art.

What is claimed is:

1. In a charge transfer device focal plane array comprising a semiconductor substrate a photodetector generating a flow of charge in response to incident radiation, a device for measuring said charge flow during plural integration periods, comprising:
   analog charge storing means having a finite charge storing capacity in said substrate for integrating the charge flow generated by said detector;
   digital count charge storing means for storing a charge packet in said substrate representative of an accumulated count;
   means for resetting the amount of charge stored in said analog storing means whenever said detector charge flow changes said amount by at least a selected fraction of said finite capacity; and means for changing the quantity of charge stored by said digital storing means by a preselected quantum whenever said resetting means resets said analog storage means.

2. The device of claim 1, further comprising an output register having a plurality of bits and means for periodically dumping the contents of said analog and digital storing means into first and second ones, respectively, of said plural bits of said register at intervals corresponding to said integration periods.

3. The device of claim 1 wherein said analog charge storing means comprises an analog storage electrode overlying said detector and a first substrate portion underlying said electrode available for storing an initial amount of charge.

4. The device of claim 3 wherein said resetting means comprises:
a region of said substrate available for storing charge;
a feedback electrode overlying said region so as to control the surface potential of said region;
means for sensing the amount of charge stored by said analog storing means;
means responsive to said sensing means, whenever said charge stored by said analog means is depleted by at least said fraction, for changing said region surface potential so as to expel charge from said region to said analog means; and
means connected to said feedback electrode and responsive to said sensing means whenever said analog stored charge has been replenished by at least said fraction, for terminating the explusion of charge to said analog means.

5. The device of claim 4 wherein said selected fraction and said selected increment are each equal to one-half said finite capacity.

6. The device of claim 3 wherein said resetting means comprise means for continuously monitoring the amount of charge stored in said analog storing means.

7. The device of claim 3 wherein said resetting means comprises means for periodically sampling the amount of charge stored in said analog storing means.

8. The device of claim 3 wherein:
said digital charge storing means comprise a digital charge storing electrode overlying said substrate; and
said changing means comprise a charge injection electrode adjacent said digital charge storing electrode and a source diffusion adjacent said charge injection electrode, said charge injection electrode being connected to said resetting means.

9. The device of claims 6 or 8 wherein said resetting means comprise:
a feedback electrode adjacent said analog electrode and a second underlying substrate portion available for storing a replenishing source of charge;
a feedback diffusion of opposite conductivity to the conductivity of said substrate underlying said feedback electrode;
a cut-on transistor comprising a first source, a first drain and a first gate, one of said first source and drain connected to said feedback diffusion, said first gate connected to said photodetector and the other of said first source and first drain connected to a first bias voltage; and
a cut-off transistor comprising a second source, a second drain and a second gate, one of said second source and drain connected to said feedback electrode, the other of said second source and drain connected to a second bias voltage and said second gate connected to said first gate and to said photodetector.

10. The device of claims 7 or 8, wherein said resetting means include a bistable latch, said latch comprising:
a first dual gate transistor having a first source, a first drain, a first gate and a second gate;
a second dual gate transistor comprising a second source, a second drain, a third gate and a fourth gate; and
a common gate reset transistor pair comprising a third source, a fifth gate and a third drain and a fourth source, a fourth drain and a sixth gate connected to said fifth gate, wherein said first gate is connected to said photodetector, said third gate is connected to a reference voltage source, one of said first source and drain is connected to receive a first bias voltage, the other of said first source and drain is connected to one of said third source and drain, one of said second source and drain is connected to receive said first bias voltage, the other of said second source and drain is connected to one of said fourth source and drain, the other of said third source and drain is connected to receive a clock signal and the other of said fourth source and drain is connected to receive said clock signal, said fifth and sixth gates are connected to receive a gate voltage, said fourth gate is connected to the other of said first source and drain, and said second gate is connected to the other of said second source and drain and is connected to said feedback electrode and to said charge injection control electrode.

11. The device of claim 1 wherein said means for changing said quantity of charge in said digital storing means comprise means for incrementally increasing said quantity.

* * * * *